United States Patent [19]
Matsumoto

[11] Patent Number: 5,291,372
[45] Date of Patent: Mar. 1, 1994

[54] INTEGRAL HEAT SINK-TERMINAL MEMBER STRUCTURE OF HYBRID INTEGRATED CIRCUIT ASSEMBLY AND METHOD OF FABRICATING HYBRID INTEGRATED CIRCUIT ASSEMBLY USING SUCH STRUCTURE

[75] Inventor: Hideo Matsumoto, Itami, Japan

[73] Assignee: Mitsubishi Denki Kabushiki Kaisha, Tokyo, Japan

[21] Appl. No.: 949,144

[22] Filed: Sep. 23, 1992

[30] Foreign Application Priority Data

Sep. 24, 1991 [JP] Japan .................... 3-242990

[51] Int. Cl.$^5$ ............................................. H05K 7/20
[52] U.S. Cl. ..................... 361/710; 361/723; 257/669; 257/675
[58] Field of Search ............ 174/52.4; 361/386–389, 361/421, 429; 257/666, 669, 675, 706

[56] References Cited

U.S. PATENT DOCUMENTS

| | | | |
|---|---|---|---|
| 3,689,684 | 9/1972 | Cox, Jr. et al. | 361/421 |
| 3,836,825 | 9/1974 | Hall et al. | 361/386 |
| 4,521,828 | 6/1985 | Fanning | 361/421 |
| 4,949,220 | 8/1990 | Tashiro | 361/388 |
| 5,053,855 | 10/1991 | Michii et al. | 361/386 |
| 5,065,281 | 11/1991 | Hernandez et al. | 361/421 |

FOREIGN PATENT DOCUMENTS

| | | |
|---|---|---|
| 0086724 | 2/1983 | European Pat. Off. . |
| 0322696 | 12/1988 | European Pat. Off. . |
| 2040938 | 4/1990 | European Pat. Off. . |
| 60-54341 | 4/1985 | Japan . |
| 0293551 | 11/1989 | Japan ................ 357/81 |

OTHER PUBLICATIONS

Film on Metal Leaded Chip Carrier, Jun. 1988, pp. 2–4, IBM Technical Disclosure Bulletin, vol. 31, No. 1.

*Primary Examiner*—Gregory D. Thompson
*Attorney, Agent, or Firm*—Leydig, Voit & Mayer

[57] ABSTRACT

An integral heat sink-terminal structure for a hybrid circuit assembly includes a heat dissipating plate for bonding to a substrate of the hybrid integrated circuit and terminals for connection to the substrate. The heat dissipating plate and the terminals are unitary with a common frame in the same predetermined positional relationship relative to the substrate before and after they are connected to the substrate. When this structure is used in fabricating a hybrid integrated circuit assembly, the heat dissipating plate is first bonded to the substrate and then the terminals are connected to the substrate.

6 Claims, 2 Drawing Sheets

INTEGRAL HEAT SINK-TERMINAL MEMBER STRUCTURE OF HYBRID INTEGRATED CIRCUIT ASSEMBLY AND METHOD OF FABRICATING HYBRID INTEGRATED CIRCUIT ASSEMBLY USING SUCH STRUCTURE

This invention relates to a hybrid integrated circuit assembly and more particularly to a heat sink section and a terminal section of a hybrid integrated circuit assembly.

BACKGROUND OF THE INVENTION

FIG. 1 shows the cross-section of a major portion of a conventional hybrid integrated circuit assembly. Various components (not shown) constituting a hybrid integrated circuit are packaged on a substrate 1. A heat sink 2 dissipates heat generated by the components on the substrate 1. The heat sink 2 comprises a land 21 to which the substrate 1 is bonded, portions or feet 22 to be soldered to a board on which the hybrid integrated circuit assembly is to be mounted, and legs 23. The heat sink 2 is bonded to the substrate 1 by a bonding agent 3. There are further provided a plurality of terminals 4 which are spaced in a direction perpendicular to the plane of the sheet of FIG. 1. Each of the terminals 4 comprises a distal portion 41 connected to the substrate 1, a proximal portion 42 soldered to the board 9, and an interconnecting portion 43 connecting the portions 41 and 42.

This hybrid integrated circuit assembly is fabricated by first packaging circuit components on the substrate 1, connecting the terminals 4 to the substrate, and after that, bonding the heat sink 2 to the substrate by means of the bonding agent 3. For connecting the terminals 4 to the substrate 1, a comb-shaped terminal member including a number of terminals 4 having respective base or outer ends of the proximal portions 42 connected to a lead body is used. After desired terminals 4 are connected to the substrate 1, the terminals 4 are separated from the lead body. Such a technique is described in, for example, Japanese Unexamined Utility Model Publication No. SHO 60-54341 published or laid open to public on Apr. 16, 1985.

The hybrid integrated circuit assembly shown in FIG. 1 is used with the heat sink feet 22 and the terminal proximal portions 42 soldered to the board 9. In this case, the surfaces of the feet 22 and the surface of each of the proximal portions 42 must be in the same plane. If they are not in the same plane, some areas will be detached from the board surface so that they cannot be soldered well to the board 9, resulting in inadequate connection. Conventionally, the terminals 4 are individually fabricated or fabricated in the form of a terminal member, and the heat sinks 2 are fabricated as individual members. That is, the terminals 4 and the heat sink 2 are fabricated separately. Therefore it occurs very frequently that the surfaces of the feet 22 of the heat sink 2 and the proximal portions 42 of the terminals 4 which are to be bonded to the board 9 are not in the same plane, due to dimensional errors of the respective parts, to which an assembling error is further added. In addition, if the substrate is warped, the warpage adds to the difference between the planes of the mounting surfaces of the portions 22 and 42, which results in inadequate connections to the board 9.

An object of the present invention is to provide a hybrid integrated circuit assembly free of the above-described disadvantage of the conventional assembly, by providing an integral heat sink-terminal member structure which is free of any difference in the planes of the surfaces of a heat sink and terminals which are soldered to a board.

Another object of the present invention is to provide a method of using such a structure or a method of manufacturing a hybrid integrated circuit assembly using such an integral heat sink-terminal member structure. According to this method, a resulting hybrid integrated circuit assembly is free of disconnection of the heat sink or terminals and the board.

SUMMARY OF THE INVENTION

According to a feature of the present invention, a heat sink and terminals for a hybrid integrated circuit assembly are formed in an integral structure including a common frame to which a heat dissipating plate constituting the heat sink to be bonded to a substrate of the hybrid integrated circuit assembly and terminals to be connected to the substrate are attached in the same positional relationship with respect to the substrate as they will assume when they are mounted on the substrate. Because of this structure, when the heat sink-terminal member structure is mounted to the substrate, the initially established positional relationship between the heat dissipating plate and the terminals is retained. Therefore the heat dissipating plate and the terminals are fixed to the substrate in a fixed positional relationship and, accordingly, when they are cut off from the frame for fixing them to a board, their positional relationship is maintained so that they can be attached to the board without introducing any improper connection.

According to another feature of the present invention, the integral heat sink-terminal member structure for a hybrid integrated circuit assembly is attached to a hybrid integrated circuit assembly by first bonding the heat dissipating plate to the substrate and then connecting the terminals to the substrate.

By first bonding the heat dissipating plate to the substrate, the relative position of the structure to the substrate is fixed so that the position of the terminals relative to the substrate is also kept correct. Therefore, by soldering the terminals to the substrate, the heat dissipating plate and the terminals are secured to the substrate in the proper relative position as established in the heat sink-terminal member structure.

DETAILED DESCRIPTION OF EMBODIMENT

Figure 2:
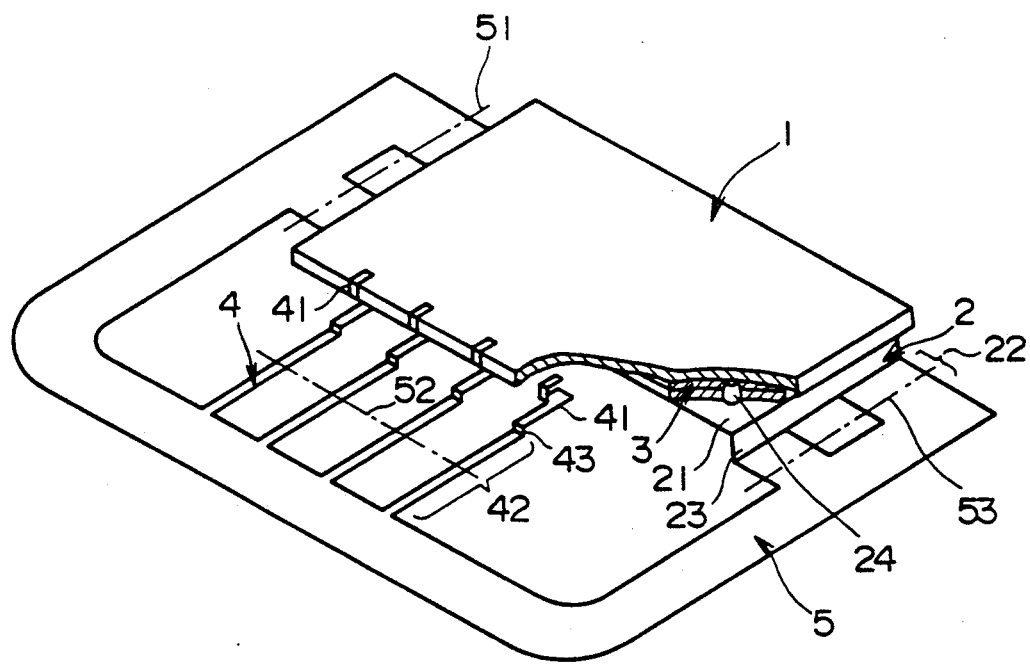
FIG. 2 is a partially broken, perspective view of an integral heat sink-terminal member structure and a hybrid integrated circuit assembly in a manufacturing step 1.

Now, the present invention is described by means of an embodiment. FIG. 2 shows a hybrid integrated circuit assembly in one step of manufacture. The hybrid integrated circuit assembly includes a substrate 1, a heat dissipating plate 2, a layer of bonding agent 3, and terminals 4.

The substrate 1 is a conventional one and may be formed of alumina and may have a thickness of 0.635 mm, a width of 12 mm, and a length of 20 mm.

Figure 1:
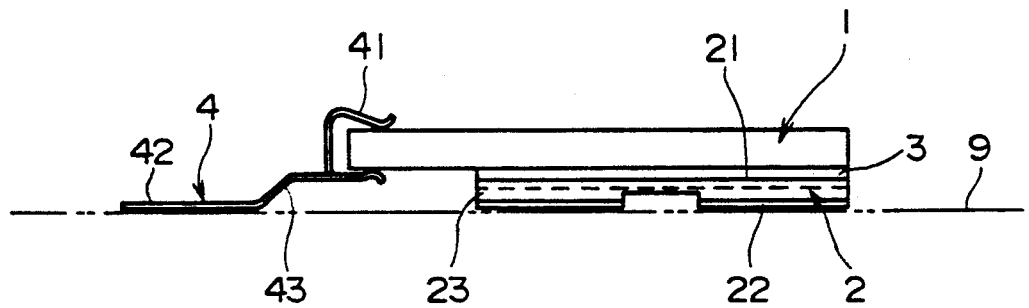
FIG. 1 is a partially cross-sectional, side view of a conventional hybrid integrated circuit assembly.

The heat dissipating plate 2 includes a land 21 to be bonded to the substrate 1, feet 22 to be soldered to a board, and legs 23 extending between the land 21 and the respective feet 22. Each of the terminals 4 comprises a distal portion 41 for connection to the substrate 1, a proximal portion 42 for soldering to a board, and an interconnecting portion 43 including the bends connecting the distal and proximal portions 41 and 42. The configurations of these components thus far described are similar to those of the conventional assembly shown in FIG. 1.

Figure 3:
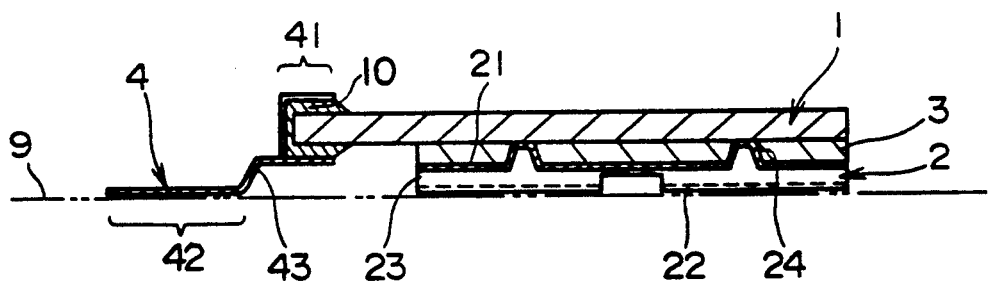
FIG. 3 is a cross-sectional view of a hybrid integrated circuit assembly using the integral heat sink-terminal member assembly shown in FIG. 2.

The hybrid integrated circuit assembly shown in FIGS. 2 and 3 differs from the conventional one in that the heat dissipating plate 2 and the terminals 4 are integrated with a frame 5 to form an integral structure 6. A plurality of projections 24 are formed in the heat dissipating plate 2, and in that the distal portions 41 of the terminals 4 for connection to the substrate 1 are configured as a stress-relief structure.

The unitary heat sink-terminal member structure 6 is pressed from an electrically conductive metal sheet, such as a sheet of Fe-Ni alloy (the proportion of Ni being 42%) having a thickness of 0.3 mm, such that the frame 5 is flat and substantially U-shaped with its open end closed by the heat dissipating plate 2, with its feet 22 connected to the frame 5, and so that the terminals 4 extend from the U-shaped frame 5 toward the heat dissipating plate 2. The proximal portions 42 of the terminals 4 connect with the frame 5. Thus, the heat dissipating plate 2 and the terminals 4 are supported by the frame 5 in a predetermined positional relationship with the substrate 2 to which they are to be mounted. In this state, the surfaces of the land 22 and the proximal portions 42 of the terminals 4 are in the same plane as the frame 5.

The projections 24 formed in the land 22 of the heat dissipating plate 2 are in the form of truncated cones, the height of which is 0.2 mm. The diameter of the top circular surface of the each truncated cone is 0.5 mm. The projections 24 provide a fixed spacing between the surface of the land 22 of the heat dissipating plate 2 and the bottom surface of the substrate 1. The spacing or the height of the projections 24 is equal to the optimum thickness of the layer 3 of a bonding agent employed. The bonding agent may be, for example, a thermally and electrically conductive silicone bonding agent. Thus, the substrate 1 and the heat dissipating plate 2 are bonded together with the top surfaces of the projections 24 kept in contact with the bottom surface of the substrate 1 so that a fixed spacing between the substrate 1 and the heat dissipating plate 2 is established by the projections 24.

Each of the distal end portions 41 of the terminals 4 is U-shaped, and is positioned relative to the substrate 1 with a spacing between the two legs of the U-shape distal portion 41 and the respective two major surfaces of the substrate 1 when they are soldered together. The sum of the spacings on the opposite sides of the substrate is about 1 mm. With this arrangement, after the terminals 4 are soldered, no stress is left in the terminals 4 and, therefore, after the terminals 4 are cut off from the frame 5 they are not deformed. When the substrate 1 is expected to be warped, such a warpage should be taken into account when the spacings between the distal portions 41 and the substrate 1 are determined, so that the terminals will not be deformed.

In making a hybrid integrated circuit assembly, using the structure 6, first the heat dissipating plate 2 is bonded to the substrate 1 and, then, the terminals 4 are connected to the substrate 1. FIG. 2 shows the frame t and the substrate after the heat dissipating plate 2 and the substrate 1 have been bonded together. In this stage, the distal portions 41 of the terminals 4 have not yet been soldered to the substrate 1. After this, the U-shaped distal portions 41 are soldered to the substrate 1 so that they are electrically connected to the substrate 1 by means of solder 10 as shown in FIG. 3.

The assembly shown in FIG. 3 is in the stage after the heat dissipating plate 2 and the terminals 4 have been cut off from the frame 5 along lines 51, 52, and 53 shown in FIG. 2. In this stage, the bottom surfaces of the feet 22 of the heat dissipating plate 2 and the proximal portions 42 of the terminals 4 are in the same plane so that when they are soldered to the board 9, there will be no improper connection between them.

In the above-described embodiment, the distal portions 41 of the terminals 4 are U-shape so that the substrate 1 can be disposed between the two legs of the U-shape. However, the distal portion 41 may be of a single sheet structure rather than the illustrated U-shaped structure. The single sheet is spaced from only one of the surfaces of the substrate 1. Even if single-sheet distal portions 41 are employed, the soldering of the terminals 4 to the substrate 1 can be made satisfactorily, since the terminals 4 are supported by the frame 5.

Furthermore, in the illustrated embodiment, a plurality of projections 24 are formed in the heat dissipating plate 2, but they need not be provided if the thickness of the bonding agent layer 3 can be uniform, since the position of the heat dissipating plate 2 relative to the substrate 1 is maintained by the frame 5.

As described in detail, according to the present invention, an integral heat sink-terminal member structure is provided, in which a heat dissipating plate and terminals are integral i.e. unitary, with a common frame in predetermined positions relative to each other and relative to a substrate to which the heat dissipating plate and the terminals are to be connected. Accordingly, when this integral heat sink-terminal member structure is used, the heat dissipating plate and the terminals can be mounted to the substrate with their correct positional relationship being maintained, so that there will be no difference in the planes of the terminals and the heat dissipating plate which are to be soldered to a circuit board. Accordingly, no improper connection of the hybrid integrated circuit assembly to the circuit board will result.

Further, in accordance with the method of fabricating the hybrid integrated circuit assembly of the present invention, since the heat dissipating plate is first fixed to the substrate, the terminals, which are next fixed to the substrate, can be placed in position relative to the substrate so that a stress-relief structure employed for the terminals, avoids any difference in the planes of the terminals and the heat dissipating plate even when the substrate is warped. Therefore the terminals can be properly mounted relative to the substrate and the board.

What is claimed is:

1. A unitary member for forming a heat sink and electrical terminals in a hybrid circuit assembly comprising:

a peripheral frame including a heat sink plate at a part of said peripheral frame for mounting of a hybrid circuit substrate and a plurality of terminals extending from a part of said peripheral frame opposite said heat sink plate toward said heat sink plate, each of said terminals including a terminal member for connection to an electrode of a hybrid circuit substrate wherein each of said terminal members includes a stress-relief structure so that said terminal members do not directly contact a substrate of a hybrid integrated circuit assembly bonded to said heat dissipating plate.

2. The unitary member according to claim 1 wherein said heat dissipating plate includes a plurality of projections for spacing a substrate bonded to said heat dissipating plate with a layer of a bonding agent a fixed distance from said heat dissipating plate.

3. The unitary member according to claim 1 wherein said heat sink plate generally lies in a first plane and said peripheral frame, except for said heat sink plate and said terminal members, generally lies in a second plane.

4. The unitary member according to claim 1 wherein each of said terminal members includes a U-shaped part for receiving a hybrid circuit substrate.

5. The unitary member according to claim 1 wherein each of said terminals includes at least two bends between said peripheral frame and said terminal member of the respective terminal.

6. A method of fabricating a hybrid integrated circuit assembly comprising:

preparing a unitary heat sink-terminal structure for a hybrid integrated circuit assembly including a heat dissipating plate for bonding to a substrate of the hybrid integrated circuit assembly, a plurality of terminals, each terminal having a terminal member for connection to a substrate of a hybrid integrated circuit assembly, and a peripheral frame, connected to the heat dissipating plate, the terminals extending from the peripheral frame toward the heat dissipating plate, wherein said heat dissipating plate and said terminal members are in a predetermined positional relationship with each other before and after said heat dissipating plate and said terminal members are connected to a substrate of a hybrid integrated circuit assembly so that said terminal members do not directly contact a substrate bonded to said heat dissipating plate;

placing said unitary heat sink-terminal structure in a predetermined relationship with respect to a substrate of a hybrid integrated circuit assembly;

bonding said heat dissipating plate to said substrate of a hybrid integrated circuit assembly; and thereafter connecting said terminal members to said substrate of a hybrid integrated circuit assembly.

* * * * *